United States Patent
Chen et al.

(10) Patent No.: US 10,474,529 B2
(45) Date of Patent: Nov. 12, 2019

(54) ERROR CHECKING AND CORRECTING DECODING METHOD AND APPARATUS

(71) Applicant: VIA Technologies, Inc., New Taipei (TW)

(72) Inventors: Ching-Yu Chen, New Taipei (TW); Yi-Lin Lai, New Taipei (TW); Chen-Te Chen, New Taipei (TW)

(73) Assignee: VIA Technologies, Inc., New Taipei (TW)

( * ) Notice: Subject to any disclaimer, the term of this patent is extended or adjusted under 35 U.S.C. 154(b) by 0 days.

(21) Appl. No.: 15/808,808

(22) Filed: Nov. 9, 2017

(65) Prior Publication Data

US 2019/0073262 A1 Mar. 7, 2019

(30) Foreign Application Priority Data

Sep. 4, 2017 (TW) .............................. 106130144 A

(51) Int. Cl.
| | |
|---|---|
| *G06F 11/00* | (2006.01) |
| *G06F 11/10* | (2006.01) |
| *H03M 13/11* | (2006.01) |
| *G11C 29/52* | (2006.01) |

(52) U.S. Cl.
CPC ..... *G06F 11/1068* (2013.01); *H03M 13/1111* (2013.01); *G11C 29/52* (2013.01)

(58) Field of Classification Search
CPC ................. G06F 11/1068; G11C 29/52; G11B 2020/185; H03M 13/255; H03M 13/1111
USPC .......................... 714/721, 760, 763, 800–805
See application file for complete search history.

(56) References Cited

U.S. PATENT DOCUMENTS

| | | | | |
|---|---|---|---|---|
| 8,429,498 | B1 * | 4/2013 | Anholt ............... | G06F 11/1048 365/227 |
| 9,270,296 | B1 * | 2/2016 | Nemati Anaraki ........................ | G06F 11/1008 |
| 10,090,862 | B2 * | 10/2018 | Lin .................... | H03M 13/2963 |
| 2008/0086675 | A1 * | 4/2008 | Wu ..................... | H03M 13/1105 714/755 |
| 2009/0187803 | A1 * | 7/2009 | Anholt ................ | G06F 11/1008 714/752 |
| 2010/0088575 | A1 * | 4/2010 | Sharon ................ | G06F 11/1072 714/763 |
| 2012/0079341 | A1 * | 3/2012 | Wajcer ................ | H03M 13/253 714/752 |

(Continued)

*Primary Examiner* — Albert Decady
*Assistant Examiner* — Osman M Alshack
(74) *Attorney, Agent, or Firm* — JCIPRNET

(57) ABSTRACT

An error checking and correcting (ECC) decoding method and apparatus are provided. A decoding circuit decodes a codeword using (or without using) reference information, wherein when the decoding circuit fails to decode a first codeword, the decoding circuit decodes a second codeword to produce decoded data. The decoding circuit checks whether a change has occurred from each codeword bit of the second codeword to a corresponding bit of the decoded data. In accordance with a bit position of the changed corresponding bit, the decoding circuit correspondingly changes the first codeword to a modified codeword, and/or correspondingly changes the reference information to modified information. The decoding circuit performs the ECC decoding again on the modified codeword (or the first codeword) using (or without using) the modified information.

15 Claims, 5 Drawing Sheets

(56) References Cited

U.S. PATENT DOCUMENTS

| | | | |
|---|---|---|---|
| 2013/0219108 A1* | 8/2013 | Yang | G06F 11/1068 711/103 |
| 2015/0169401 A1* | 6/2015 | Tseng | G06F 11/1068 714/773 |
| 2016/0020784 A1* | 1/2016 | Tseng | H03M 13/1128 714/752 |
| 2016/0112068 A1* | 4/2016 | Kim | H03M 13/1108 714/755 |
| 2016/0246603 A1* | 8/2016 | Watanabe | G06F 9/30145 |

* cited by examiner

ERROR CHECKING AND CORRECTING DECODING METHOD AND APPARATUS

CROSS-REFERENCE TO RELATED APPLICATION

This application claims the priority benefit of Taiwan application serial no. 106130144, filed on Sep. 4, 2017. The entirety of the above-mentioned patent application is hereby incorporated by reference herein and made a part of this specification.

BACKGROUND OF THE INVENTION

Field of the Invention

The invention relates to a decoding technique, particularly to an error checking and correcting decoding method and apparatus.

Description of Related Art

Under common circumstances, a flash memory may have damaged bit cells or damaged bit lines. No matter what data is inputted to these damaged bit cells, the damaged bit cells will output data "1." In such cases, information input to a low density parity check (LDPC) decoder may have an error value. For example, a codeword bit value of 0 (also called strong 0) having reliability information of "strongly reliable" may become a codeword bit value of 1 (also called strong 1) having reliability information of "strongly reliable." Said reliability information is also called a weight. The error value lowers the decoding capability of the LDPC decoder.

If positions of the damaged bits/bit lines are previously known, it is possible to mark these positions as erasure so as to prevent an LCPC engine from being misled. However, this method requires huge storage space for recording the damaged bits/bit lines.

SUMMARY OF THE INVENTION

The invention provides an error checking and correcting (hereinafter ECC) decoding method and an ECC decoding apparatus, so as to improve a decoding capability.

An embodiment of the invention provides an ECC decoding method. Said ECC decoding method includes the following steps. At least one codeword outputted from a non-volatile memory is temporarily stored by a buffer circuit. By a decoding circuit, an ECC decoding operation is performed on said at least one codeword, or the ECC decoding operation is performed on said at least one codeword using reference information, wherein when the decoding circuit fails to decode a first codeword of said at least one codeword by the ECC decoding operation, the decoding circuit performs the ECC decoding operation on a second codeword of said at least one codeword to produce decoded data. By the decoding circuit, whether a change has occurred from each codeword bit of the second codeword to a corresponding bit of the decoded data is checked. By the decoding circuit, in accordance with a bit position of the changed corresponding bit, a bit value located in the bit position in the first codeword is correspondingly changed to change the first codeword to a modified codeword, or a reference value located in the bit position in the reference information is correspondingly changed to change the reference information to modified information. By the decoding circuit, the ECC decoding operation is performed again on the modified codeword, or the ECC decoding operation is performed again on the first codeword using the modified information, or the ECC decoding operation is performed again on the modified codeword using the modified information.

An embodiment of the invention provides an ECC decoding apparatus. Said ECC decoding apparatus includes a buffer circuit and a decoding circuit. The buffer circuit temporarily stores at least one codeword outputted from a non-volatile memory. The decoding circuit is coupled to the buffer circuit. The decoding circuit may perform an ECC decoding operation on said at least one codeword, or may perform the ECC decoding operation on said at least one codeword using reference information, wherein when the decoding circuit fails to decode a first codeword of said at least one codeword by the ECC decoding operation, the decoding circuit performs the ECC decoding operation on a second codeword of said at least one codeword to produce decoded data. The decoding circuit checks whether a change has occurred from each codeword bit of the second codeword to a corresponding bit of the decoded data. In accordance with a bit position of the changed corresponding bit, the decoding circuit correspondingly changes a bit value located in the bit position in the first codeword to change the first codeword to a modified codeword, or correspondingly changes a reference value located in the bit position in the reference information to change the reference information to modified information. The decoding circuit performs the ECC decoding operation again on the modified codeword, or performs the ECC decoding operation again on the first codeword using the modified information, or performs the ECC decoding operation again on the modified codeword using the modified information.

Based on the above, in the ECC decoding method and the ECC decoding apparatus according to the embodiments of the invention, specific information is captured from a successfully decoded codeword, and the specific information is provided as feedback to a codeword which has failed to be decoded and on which decoding is then performed again. After the decoding is performed again, the codeword which originally failed to be decoded tends to become capable of being successfully decoded due to the specific information. Therefore, the ECC decoding method and the ECC decoding apparatus according to the embodiments of the invention may improve the decoding capability.

To make the above features and advantages of the invention more comprehensible, several embodiments accompanied with drawings are described in detail as follows.

DETAILED DESCRIPTION OF DISCLOSED EMBODIMENTS

Figure 1:
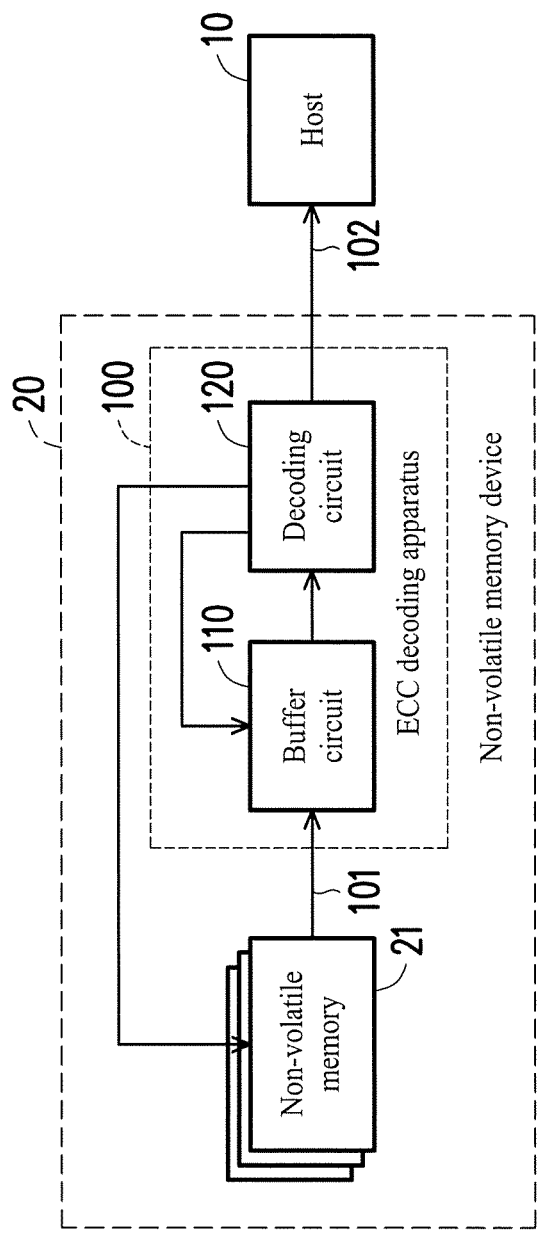
FIG. 1 illustrates a schematic circuit block diagram of a non-volatile memory device according to an embodiment of the invention.

The term "couple (or connect)" used in this specification (including claims) may refer to any direct or indirect connection means. For example, "a first device is coupled (or connected) to a second device" should be interpreted as "the first device is directly connected to the second device" or "the first device is indirectly connected to the second device through other devices or connection means." Moreover, wherever appropriate in the drawings and embodiments, elements/components/steps with the same reference numerals represent the same or similar parts. Elements/components/steps with the same reference numerals or names in different embodiments may be cross-referenced.

FIG. 1 illustrates a schematic circuit block diagram of a non-volatile memory device 20 according to an embodiment of the invention. Depending on design needs, the non-volatile memory device 20 may be a USB flash drive, a solid-state disk (SSD) or any other storage device. The non-volatile memory device 20 may be coupled to a host 10. The host 10 may be a computer, a handheld phone, a multimedia player, a camera or any other electronic device. When the host 10 issues a read command to the non-volatile memory device 20, the non-volatile memory device 20 may return corresponding data to the host 10 according to an address of the read command.

In the embodiment shown in FIG. 1, the non-volatile memory device 20 includes a non-volatile memory 21 and an error checking and correcting (hereinafter ECC) decoding apparatus 100. Depending on design needs, the non-volatile memory 21 may be a NAND flash memory or any other non-volatile storage circuit/element. When the host 10 issues a read command, the non-volatile memory 21 outputs a corresponding codeword 101 to the ECC decoding apparatus 100 according to an address of the read command. Then, the ECC decoding apparatus 100 decodes the codeword 101 so as to return corresponding decoded data 102 to the host 10. For example, in some embodiments, the ECC decoding apparatus 100 may perform a low density parity check (hereinafter LDPC) code algorithm or any other ECC algorithm, thereby decoding the codeword 101 to produce the decoded data 102.

The non-volatile memory 21 may set at least one read voltage (also called threshold voltage) according to one (or a set of) read voltage parameter of the read command, and read a set of corresponding data voltages according to the address of the read command. According to said at least one read voltage, the non-volatile memory 21 may convert the set of corresponding data voltages into the corresponding codeword 101. Depending on design needs, the non-volatile memory 21 may be a single level cell (SLC) flash memory, a multi-level cell (MLC) flash memory, a triple level cell (TLC) flash memory, a quadruple level cell (QLC) flash memory or any other type of flash memory.

Taking an MLC flash memory as an example, a memory cell has a high page and a low page, and a memory cell may therefore store two-bit information. The high page and the low page of the same memory cell are also called "paired pages." The low page has one read voltage (also called threshold voltage), and the high page has two read voltages. The non-volatile memory 21 may set a high page read voltage VtU1, a high page read voltage VtU2 and a low page read voltage VtL according to a command from the ECC decoding apparatus 100. According to the read voltages VtU1, VtU2 and VtL, the non-volatile memory 21 may convert the set of corresponding data voltages into the corresponding codeword 101.

Without loss of generality, as compared to the high page, the low page may have higher capability of error resistance. With respect to the same paired pages, in a situation in which a codeword of the high page cannot be correctly decoded, a codeword of the low page may be capable of being correctly decoded. In the following embodiments, information (i.e., specific information) of a correctly decoded codeword in the runtime will be used as a reference, and the specific information will then be provided as feedback for a codeword which has failed to be decoded and on which decoding will then be performed again, thereby enhancing the ECC capability.

In the following embodiments, an LDPC decoding method will be described for exemplary purposes. During the LDPC decoding process, a codeword is accompanied by a set of "reliability information" (also called a weight) that is used to describe credibility of each bit value of the codeword. The LDPC decoding method is a conventional technique and details thereof are thus omitted herein. The other ECC decoding methods may also have "reliability information." Hence, the invention may also be applied to the other ECC decoding methods with reference to the description of the following embodiments. For easy explanation, herein, a codeword bit value of 0 with reliability information of "strongly reliable" is called "strong 0," a codeword bit value of 0 with reliability information of "weakly reliable" is called "weak 0," a codeword bit value of 1 with reliability information of "weakly reliable" is called "weak 1," and a codeword bit value of 1 with reliability information of "strongly reliable" is called "strong 1."

If a bit value of a bit memory cell in the low page (or high page) is successfully decoded from strong 0 into 1 (either strong 1 or weak 1) or is successfully decoded from strong 1 into 0 (either strong 0 or weak 0), this bit memory cell may be a damaged cell, or a bit line of this bit memory cell may be a damaged bit line. Accordingly, specific information may be captured from a successfully decoded codeword, and this specific information may indicate that a certain bit line (or certain bit lines) of the successfully decoded codeword may be a damaged bit line (or damaged bit lines). Then, this specific information is provided as feedback for a codeword which has failed to be decoded and on which decoding is then performed again. Depending on design needs, a way of providing said "feedback" may include weakening the weight, marking erasure, flipping data and/or any other methods or means. After the decoding is performed again, the codeword which originally failed to be decoded tends to become capable of being successfully decoded due to the specific information.

The ECC decoding apparatus 100 shown in FIG. 1 includes a buffer circuit 110 and a decoding circuit 120. The buffer circuit 110 may temporarily store the codeword 101 outputted from the non-volatile memory 21. The decoding circuit 120 is coupled to the buffer circuit 110. In some embodiments, the ECC decoding method may have no "reliability information." Accordingly, the decoding circuit 120 may perform an ECC decoding operation (e.g., a hard decoding operation) on a codeword provided by the buffer circuit 110. In some other embodiments, the ECC decoding method may have the "reliability information." Accordingly, the decoding circuit 120 may perform an ECC decoding operation (e.g., an LDPC soft decoding operation) on the codeword provided by the buffer circuit 110 using the reference information. In an embodiment, the aforementioned reliability information is a soft value. For easy explanation, in the following embodiments, a codeword which has ever failed to be decoded by an ECC decoding operation will be referred to as a "first codeword," and a codeword which is successfully decoded by an ECC decoding operation will be referred to as a "second codeword," wherein the first codeword and the second codeword come from the same bit line in the non-volatile memory 21. In some embodiments, the first codeword and the second codeword come from different pages of the same paired pages in the non-volatile memory 21. In some other embodiments, the first codeword and the second codeword come from different paired pages in the non-volatile memory 21. Once the ECC decoding operation succeeds, the decoding circuit 120 may produce the decoded data 102 according to the codeword and output the decoded data 102 to the host 10.

Figure 2:
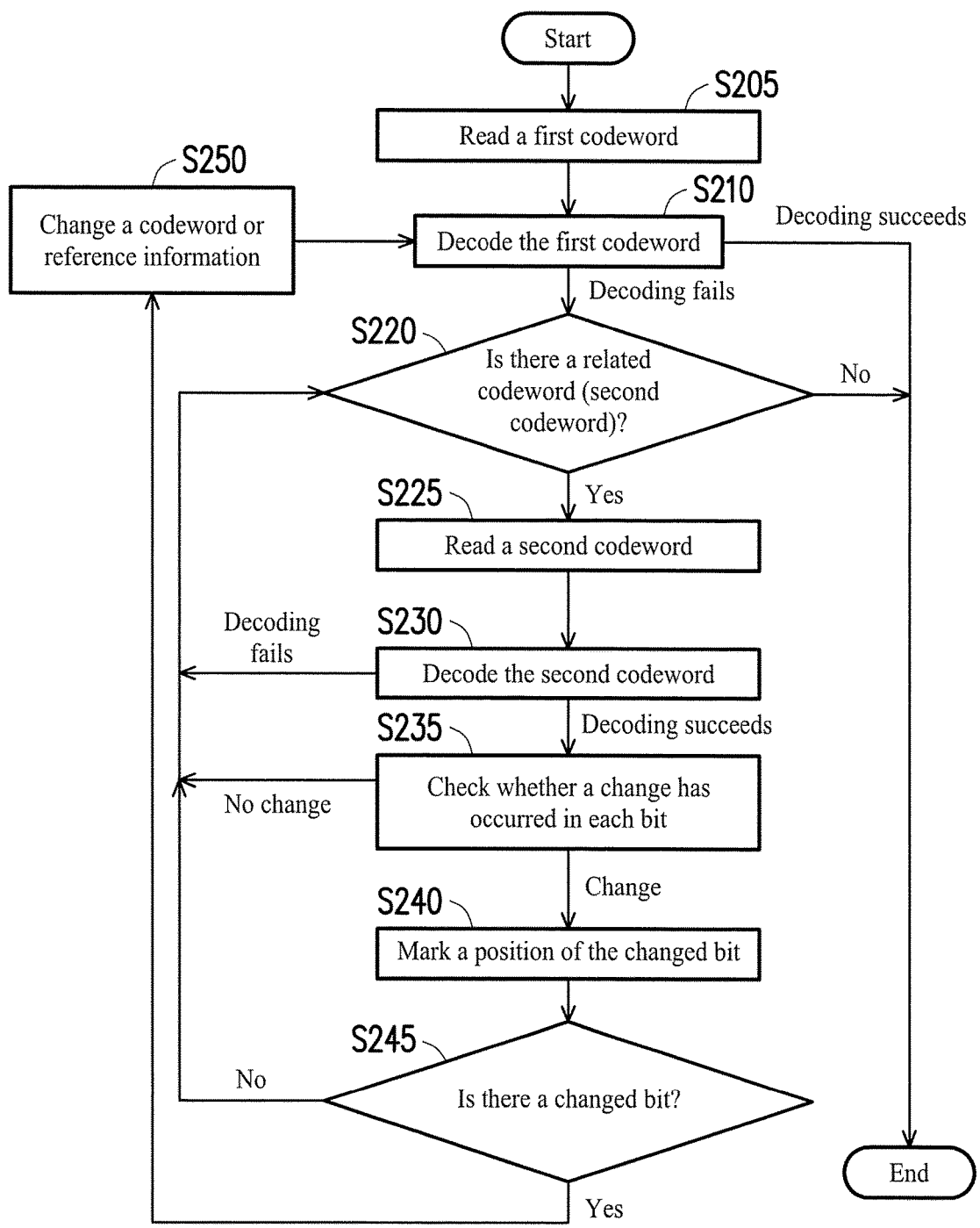
FIG. 2 illustrates a schematic flowchart of an error checking and correcting decoding method according to an embodiment of the invention.

FIG. 2 illustrates a schematic flowchart of an error checking and correcting decoding method according to an embodiment of the invention. Please refer to FIG. 1 and FIG. 2. In step S205, the ECC decoding apparatus 100 reads the codeword 101 (e.g., the first codeword) from the non-volatile memory 21 and temporarily stores the codeword 101 in the buffer circuit 110. In step S210, the decoding circuit 120 performs an ECC decoding operation on the first codeword provided by the buffer circuit 110, or the decoding circuit 120 performs the ECC decoding operation on the first codeword provided by the buffer circuit 110 using the "reference information." If it is determined in step S210 that the first codeword is successfully decoded, the decoding of the first codeword is ended. Once the decoding circuit 120 fails to decode the first codeword provided by the buffer circuit 110 by the ECC decoding operation, the decoding circuit 120 will subsequently perform step S220.

In step S220, a controller (e.g., a controller 121 shown in FIG. 5) of the ECC decoding apparatus 100 looks for another codeword (related codeword) related to said first codeword. Depending on design needs, said related codeword may be another codeword sharing the same bit line with said first codeword. In some embodiments, the first codeword and said related codeword come from different pages of the same paired pages in the non-volatile memory 21. In some other embodiments, the first codeword and said related codeword come from different paired pages in the non-volatile memory 21. If no related codeword of said first codeword is found in step S220, the decoding circuit 120 determines that the decoding operation on said first codeword fails and ends the decoding of the first codeword. If the related codeword (hereinafter referred to as the second codeword) of said first codeword is found in step S220, the decoding circuit 120 performs step S225.

In step S225, the ECC decoding apparatus 100 reads the codeword 101 (e.g., the second codeword) from the non-volatile memory 21 and temporarily stores the codeword 101 in the buffer circuit 110. In step S230, the decoding circuit 120 performs the ECC decoding operation on the second codeword provided by the buffer circuit 110, or the decoding circuit 120 performs the ECC decoding operation on the second codeword provided by the buffer circuit 110 using the "reference information." When the decoding circuit 120 fails to decode the second codeword by the ECC decoding operation, the decoding circuit 120 will perform step S220 again to look for another related codeword related to said first codeword. Once the decoding circuit 120 successfully decodes the second codeword provided by the buffer circuit 110 by the ECC decoding operation, the decoding circuit 120 may produce the decoded data 102 to the host 10, and the decoding circuit 120 will subsequently perform step S235.

In step S235, the decoding circuit 120 may check whether a change has occurred from each codeword bit of the second codeword to a corresponding bit of the decoded data 102. When no "change" has occurred in each codeword bit of the second codeword, the decoding circuit 120 will perform step S220 again to look for another related codeword related to said first codeword. When a "change" has occurred in one (or more) codeword bit of the second codeword, the decoding circuit 120 will perform step S240. The conditions for causing said "change" to occur may be determined according to design needs. For example, in some embodiments, that the "change" has occurred in said corresponding bit refers to a situation in which "the change has occurred from a codeword bit of the second codeword to the corresponding bit of the decoded data." For example, a bit value of the second codeword is 0 and a corresponding bit value of the decoded data is 1, or a bit value of the second codeword is 1 and a corresponding bit value of the decoded data is 0. In some other embodiments, that the "change" has occurred in said corresponding bit refers to a situation in which "the change has occurred from a codeword bit of the second codeword to the corresponding bit of the decoded data, and the reliability information of the codeword bit indicates that the codeword bit is strongly reliable." For example, a bit value of the second codeword is strong 0 and a corresponding bit value of the decoded data is 1 (either strong 1 or weak 1), or a bit value of the second codeword is strong 1 and a corresponding bit value of the decoded data is 0 (either strong 0 or weak 0).

In step S240, with respect to the bit (or bits) in the second codeword in which the change mentioned in step S235 has occurred, the decoding circuit 120 may mark/record a position of the bit (or bits). Information (specific information) of the position marked/recorded in step S240 may be provided as feedback for the first codeword which has failed to be decoded. That is, said specific information is provided for step S245. That is, in the situation in which the second codeword is successfully decoded by the ECC decoding operation, the decoding circuit 120 may perform the ECC decoding operation again on the first codeword which originally failed to be decoded.

In step S245, the decoding circuit 120 may determine whether the position marked/recorded in step S240 is present among all bit positions of said first codeword (the codeword which originally failed to be decoded). If another codeword (e.g., the second codeword) sharing the same bit line with the first codeword is successfully decoded, in steps S235 to S240, the specific information (the bit position of the changed bit) may be captured from the successfully decoded second codeword for step S245. If it is determined in step S245 that all the bit positions of said first codeword (the codeword which originally failed to be decoded) fail to match the position marked/recorded in step S240, the decoding circuit 120 will perform step S220 again to look for another related codeword related to said first codeword. If none of the other related codewords (e.g., another codeword sharing the same bit line with said first codeword) related to said first codeword has said specific information, the decoding operation on said first codeword is ended. If it is determined in step S245 that another codeword (e.g., the second codeword) sharing the same bit line with said first codeword may provide said specific information (the bit position of the changed bit), the decoding circuit 120 will perform step S250.

In step S250, in accordance with a bit position of the changed corresponding bit, the decoding circuit 120 correspondingly changes a bit value located in the marked bit position (the position marked in step S240) in said first codeword to change the first codeword to a modified codeword, and/or correspondingly changes a reference value located in the marked bit position (the position marked in step S240) in the reference information to change the reference information to modified information. After completing step S250, the decoding circuit 120 subsequently performs step S210 again. In step S210, the decoding circuit 120 performs the ECC decoding operation again on said modified codeword, or performs the ECC decoding operation again on the first codeword using said modified information, or performs the ECC decoding operation again on said modified codeword using said modified information.

For example, in a case of "flipping data," in step S250, the decoding circuit 120 may change a bit value "0" located in the marked bit position (the position marked in step S240) in said first codeword to "1," or change "1" to "0," thus obtaining a modified codeword. In step S210, the decoding circuit 120 may perform the ECC decoding operation again on said modified codeword. In other words, the specific information (the bit position of the changed bit) is captured from the successfully decoded second codeword, and the specific information is then provided as feedback for the first codeword which has failed to be decoded and on which the ECC decoding operation is then performed again. After the ECC decoding operation is performed again, the first codeword which originally failed to be decoded tends to become capable of being successfully decoded due to this specific information.

In a case of "weakening the weight," said "reference information" may include reliability information (also called a weight). When the mark information in step S240 indicates that a change has occurred from a codeword bit of the second codeword (another codeword which can be successfully decoded) to a corresponding bit of the decoded data, and the reliability information of the codeword bit indicates that the codeword bit is "strongly reliable," in step S250, the decoding circuit 120 may change the reliability information of the codeword bit from "strongly reliable" to "weakly reliable," thus obtaining modified information. In this example, said first codeword will not be changed, i.e., the codeword bit will be changed from "strong 1" to "weak 1," or from "strong 0" to "weak 0." In step S210, the decoding circuit 120 may perform the ECC decoding operation again on the first codeword using said modified information. In other words, the specific information (the bit position of the changed bit) is captured from the successfully decoded second codeword, and the specific information is then provided as feedback for the reliability information (also called the weight) of the first codeword which has failed to be decoded and on which the ECC decoding operation is then performed again. After the ECC decoding operation is performed again, the first codeword which originally failed to be decoded tends to become capable of being successfully decoded due to this specific information.

In a case of combining "flipping data" with "weakening the weight," when the mark information in step S240 indicates that a change has occurred from a codeword bit of the second codeword (another codeword which can be successfully decoded) to a corresponding bit of the decoded data, and the reliability information of the codeword bit indicates that the codeword bit is "strongly reliable," in step S250, the decoding circuit 120 may change the codeword bit from "strong 1" to "weak 0" or from "strong 0" to "weak 1," thus obtaining a modified codeword and modified information. In step S210, the decoding circuit 120 may perform the ECC decoding operation again on said modified codeword using said modified information. In other words, the specific information (the bit position of the changed bit) is captured from the successfully decoded second codeword, and the specific information is then provided as feedback for the first codeword which has failed to be decoded and the reliability information (also called the weight) thereof, and the ECC decoding operation is then performed again. After the ECC decoding operation is performed again, the first codeword which originally failed to be decoded tends to become capable of being successfully decoded due to this specific information.

In a case of "marking erasure," said "reference information" may include reliability information (also called a weight) and erasure information. When the mark information in step S240 indicates that a change has occurred from a codeword bit of the second codeword (another codeword which can be successfully decoded) to a corresponding bit of the decoded data, and the reliability information of the codeword bit indicates that the codeword bit is "strongly reliable," in step S250, the decoding circuit 120 may mark erasure information of the codeword bit as "neutral," thus obtaining modified information. Said erasure information of "neutral" is used to mark a value of the codeword bit as "neither logic 0 nor logic 1." The "erasure information" in the LDPC decoding method is a conventional technique and details thereof are thus omitted. In step S210, the decoding circuit 120 may perform the ECC decoding operation again on the first codeword using said modified information. In other words, the specific information (the bit position of the changed bit) is captured from the successfully decoded second codeword, and the specific information is then provided as feedback for the erasure information of the first codeword which has failed to be decoded and on which the ECC decoding operation is then performed again. After the ECC decoding operation is performed again, the first codeword which originally failed to be decoded tends to become capable of being successfully decoded due to this specific information.

Figure 3:
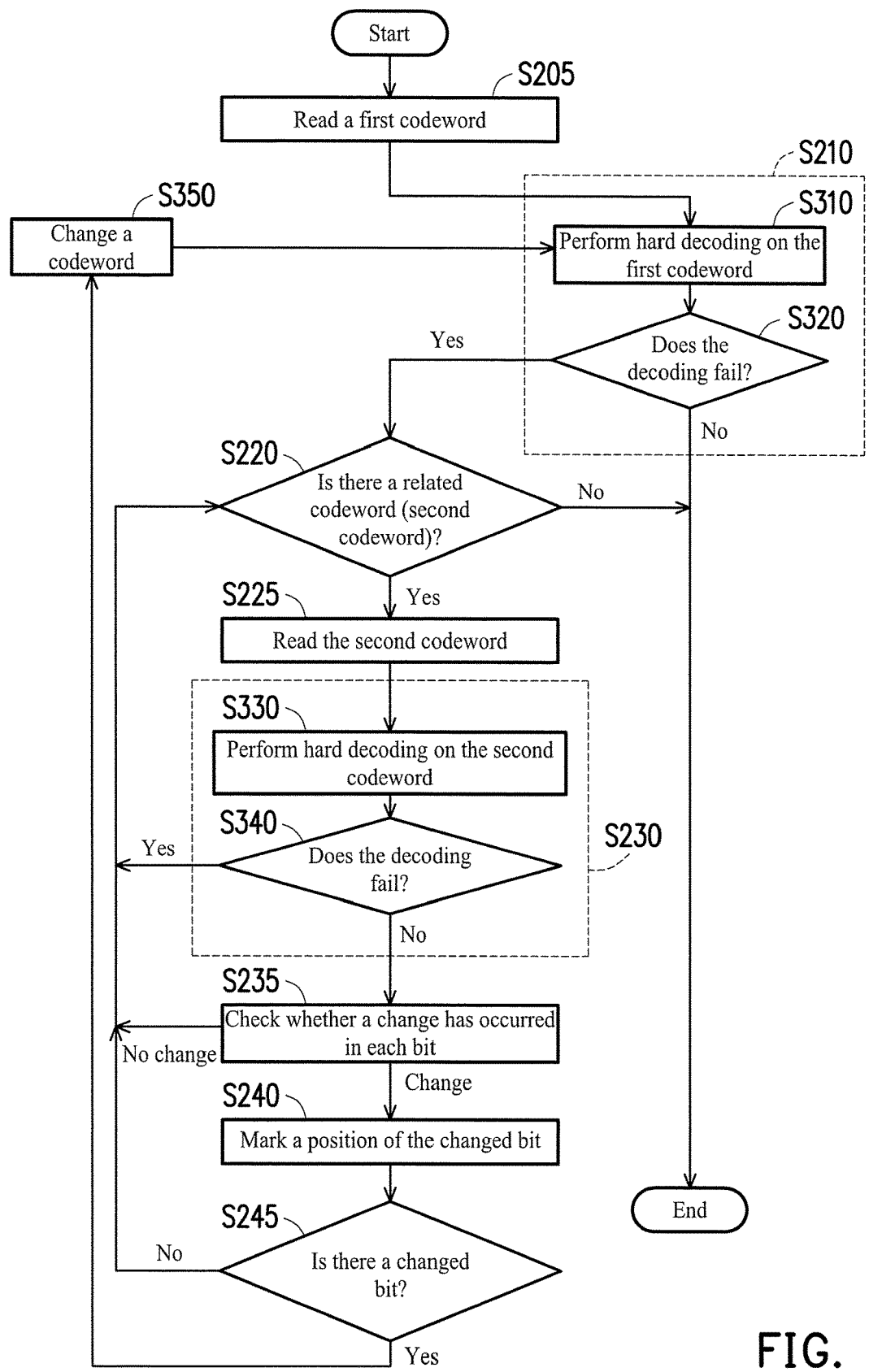
FIG. 3 illustrates a schematic flowchart of an error checking and correcting decoding method according to another embodiment of the invention.

FIG. 3 illustrates a schematic flowchart of an error checking and correcting decoding method according to another embodiment of the invention. Steps S205, S210, S220, S225, S230, S235, S240 and S245 shown in FIG. 3 can be understood by referring to the relevant descriptions of FIG. 2, and details thereof are thus omitted. In the embodiment shown in FIG. 3, step S210 includes steps S310 and S320, and step S230 includes steps S330 and S340. The buffer circuit 110 is configured to temporarily store the codeword 101 (e.g., the first codeword and the second codeword) outputted from the non-volatile memory 21. In step S310, the decoding circuit 120 performs a hard decoding operation on the first codeword provided by the buffer circuit 110. In step S330, the decoding circuit 120 performs the hard decoding operation on the second codeword provided by the buffer circuit 110. Said hard decoding is a conventional technique and details thereof are thus omitted. In step S320, the decoding circuit 120 may determine whether the hard decoding of the first codeword has failed. If it is determined in step S320 that the hard decoding of the first codeword has succeeded, the decoding of the first codeword is ended. If it is determined in step S320 that the hard decoding of the first codeword has failed, the decoding circuit 120 will subsequently perform step S220. If it is determined in step S340 that the hard decoding of the second codeword has succeeded, the decoding circuit 120 may produce the decoded data 102 to the host 10, and the decoding circuit 120 will subsequently perform steps S235 and S240. The information (specific information) of the position marked/recorded in step S240 may be provided as feedback for the first codeword which has failed to be decoded. That is, in the situation in which the second codeword is successfully decoded by the hard decoding operation, in step S210, the hard decoding operation may be performed again on the first codeword which originally failed to be decoded.

In step S245, the decoding circuit 120 may determine whether the position marked/recorded in step S240 is present among all bit positions of the first codeword (the codeword which has failed to be decoded by the hard decoding operation). If it is determined in step S245 that all the bit positions of said first codeword (the codeword which has failed to be decoded by the hard decoding operation) fail to match the position marked/recorded in step S240, the decoding circuit 120 will perform step S220 again to look for another related codeword related to said first codeword. If none of the other related codewords (e.g., another codeword sharing the same bit line with said first codeword) related to said first codeword has said specific information, the decoding operation on said first codeword is ended. If it is determined in step S245 that another codeword (e.g., the second codeword, i.e., another codeword which is successfully decoded by the hard decoding operation) sharing the same bit line with said first codeword may provide said specific information (the bit position of the changed bit), the decoding circuit 120 will perform step S350. In step S350, in accordance with a bit position of the changed corresponding bit, the decoding circuit 120 correspondingly changes a bit value located in the marked bit position (the position marked in step S240) in said first codeword to change the first codeword to a modified codeword. After completing step S350, the decoding circuit 120 subsequently performs step S310 again. In step S310, the decoding circuit 120 performs the hard decoding operation again on said modified codeword.

For example, in step S350, the decoding circuit 120 may change a bit value "0" located in the marked bit position (the position marked in step S240) in said first codeword to "1," or change "1" to "0," thus obtaining a modified codeword. In step S310, the decoding circuit 120 may perform the hard decoding operation again on said modified codeword. In other words, the specific information (the bit position of the changed bit) is captured from the successfully decoded second codeword, and the specific information is then provided as feedback for the first codeword which has failed to be decoded and on which the hard decoding operation is then performed again. After the hard decoding operation is performed again, the first codeword which originally failed to be decoded tends to become capable of being successfully decoded due to this specific information.

Figure 4:
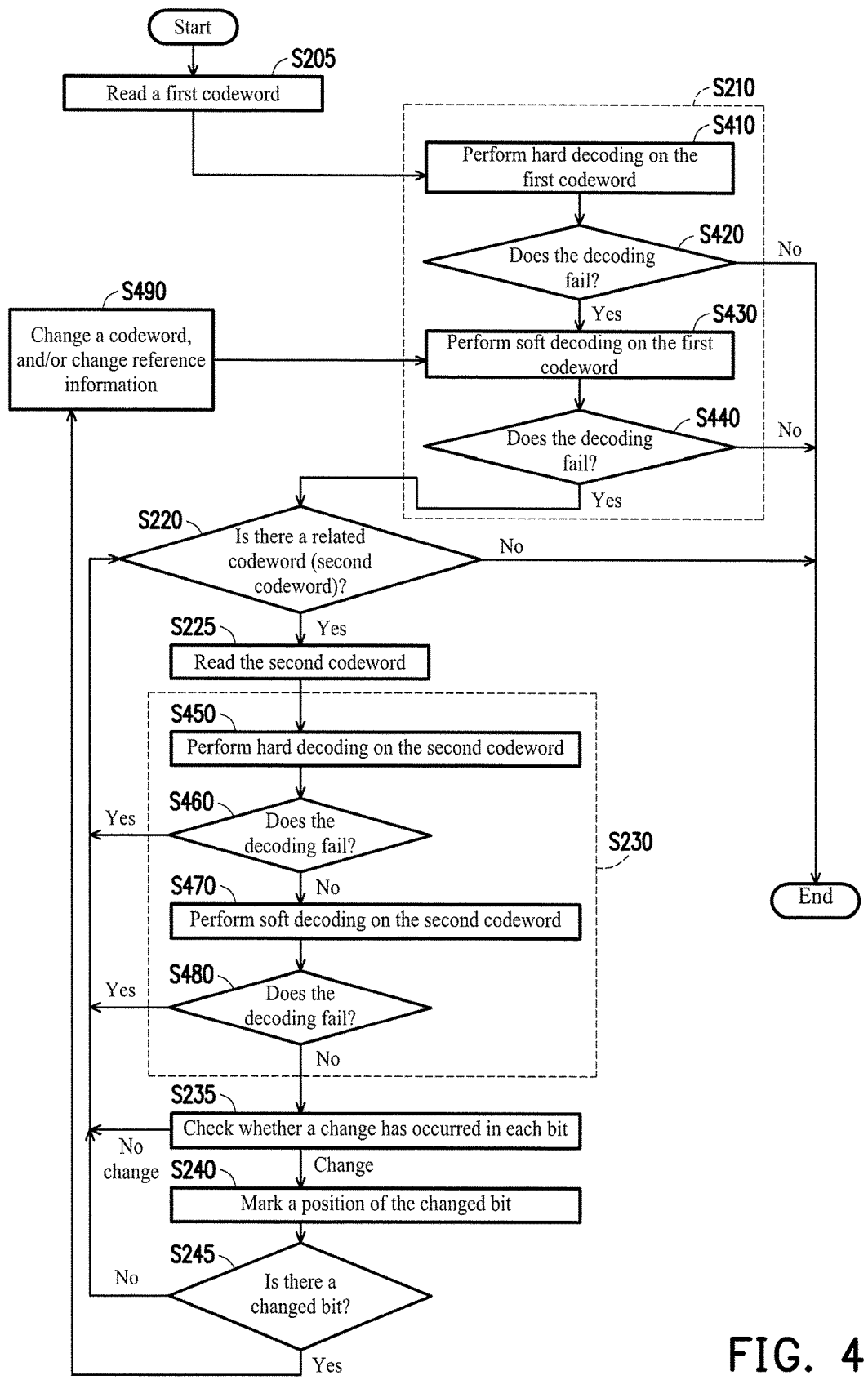
FIG. 4 illustrates a schematic flowchart of an error checking and correcting decoding method according to still another embodiment of the invention.

FIG. 4 illustrates a schematic flowchart of an error checking and correcting decoding method according to still another embodiment of the invention. Steps S205, S210, S220, S225, S230, S235, S240 and S245 shown in FIG. 4 can be understood by referring to the relevant descriptions of FIG. 2, and details thereof are thus omitted. In the embodiment shown in FIG. 4, step S210 includes steps S410, S420, S430 and S440. Step S230 includes steps S450, S460, S470 and S480. Steps S410 and S420 shown in FIG. 4 can be understood by referring to the relevant descriptions of steps S310 and S320 shown in FIG. 3, steps S450 and S460 shown in FIG. 4 can be understood by referring to the relevant descriptions of steps S330 and S340 shown in FIG. 3, and details thereof are thus omitted. If it is determined in step S420 that the hard decoding of the first codeword has succeeded, the decoding of the first codeword is ended. If it is determined in step S420 that the hard decoding of the first codeword has failed, the decoding circuit 120 will subsequently perform step S430.

In step S430, the decoding circuit 120 performs a soft decoding operation on the first codeword provided by the buffer circuit 110. Said soft decoding may be a well-known LDPC decoding algorithm or any other decoding algorithm, and details thereof are thus omitted. If it is determined in step S440 that said soft decoding of the first codeword has succeeded, the decoding circuit 120 may produce the decoded data 102 to the host 10 and ends the decoding operation on the first codeword. If it is determined in step S440 that the soft decoding of the first codeword has failed, the decoding circuit 120 will subsequently perform step S220.

If it is determined in step S460 that the hard decoding of the second codeword has failed, the decoding circuit 120 will subsequently perform step S470. If it is determined in step S460 that the hard decoding of the second codeword has failed, the decoding circuit 120 will subsequently perform step S220. In step S470, the decoding circuit 120 performs the soft decoding operation on the codeword (e.g., the second codeword) provided by the buffer circuit 110. Said soft decoding may be a well-known LDPC decoding algorithm or any other decoding algorithm, and details thereof are thus omitted. If it is determined in step S480 that said soft decoding of the second codeword has failed, the decoding circuit 120 will subsequently perform step S220. If it is determined in step S480 that said soft decoding of the second codeword has succeeded, the decoding circuit 120 may produce the decoded data 102 to the host 10, and the decoding circuit 120 will subsequently perform steps S235 and S240. The information (specific information) of the position marked/recorded in step S240 may be provided as feedback for the first codeword which has failed to be decoded. That is, in the situation in which the second codeword is successfully decoded by the ECC decoding operation, in step S210, the hard decoding operation and/or the soft decoding operation may be performed again on the first codeword which originally failed to be decoded.

In step S245, the decoding circuit 120 may determine whether the position marked/recorded in step S240 is present among all the bit positions of the first codeword (the codeword which has failed to be decoded by the hard decoding operation and/or by the soft decoding operation). If it is determined in step S245 that all the bit positions of said first codeword (the codeword which has failed to be decoded by the hard decoding operation and/or by the soft decoding operation) fail to match the position marked/recorded in step S240, the decoding circuit 120 will perform step S220 again to look for another related codeword related to said first codeword. If none of the other related codewords (e.g., another codeword sharing the same bit line with said first codeword) related to said first codeword has said specific information, the decoding operation on said first codeword is ended. If it is determined in step S245 that another codeword (e.g., the second codeword, i.e., another codeword which is successfully decoded by the hard decoding operation) sharing the same bit line with said first codeword may provide said specific information (the bit position of the changed bit), the decoding circuit 120 will perform step S490. In step S490, in accordance with a bit position of the changed corresponding bit, the decoding circuit 120 correspondingly changes a bit value located in the marked bit position (the position marked in step S240) in said first codeword to change the first codeword to a modified codeword, and/or correspondingly changes a reference value located in the marked bit position (the position marked in step S240) in the reference information to change the reference information to modified information. Step S490 shown in FIG. 4 can be understood by referring to the relevant descriptions of step S250 shown in FIG. 2, and details thereof are thus omitted. After completing step S490, the decoding circuit 120 subsequently performs step S430 again.

In step S430, the decoding circuit 120 performs said soft decoding operation again on said modified codeword, or performs said soft decoding operation again on the first codeword using said modified information, or performs said soft decoding operation again on said modified codeword using said modified information. For example, in a case of "flipping data," in step S490, the decoding circuit 120 may change a bit value "strong 0" located in the marked bit position (the position marked in step S240) in said first codeword to "strong 1," or change "strong 1" to "strong 0," or change "weak 1" to "weak 0," or change "weak 0" to "weak 1," thus obtaining a modified codeword. In this example, the reliability information of said first codeword will not be changed. In step S430, the decoding circuit 120 may perform said soft decoding operation again on said modified codeword. In other words, the specific information (the bit position of the changed bit) is captured from the successfully decoded second codeword, and the specific information is then provided as feedback for the first codeword which has failed to be decoded and on which said soft decoding operation is then performed again. After said soft decoding operation is performed again, the first codeword which originally failed to be decoded tends to become capable of being successfully decoded due to this specific information.

In a case of "weakening the weight," said "reference information" may include reliability information (also called a weight). When the mark information in step S240 indicates that a change has occurred from a codeword bit of the second codeword (another codeword which can be successfully decoded) to a corresponding bit of the decoded data, and the reliability information of the codeword bit indicates that the codeword bit is "strongly reliable," in step S490, the decoding circuit 120 may change the reliability information of the codeword bit from "strongly reliable" to "weakly reliable," thus obtaining modified information. In this example, said first codeword will not be changed, i.e., the codeword bit will be changed from "strong 1" to "weak 1," or from "strong 0" to "weak 0." In step S430, the decoding circuit 120 may perform said soft decoding operation again on the first codeword using said modified information. In other words, the specific information (the bit position of the changed bit) is captured from the successfully decoded second codeword, and the specific information is then provided as feedback for the reliability information (also called the weight) of the first codeword which has failed to be decoded and on which said soft decoding operation is then performed again. After said soft decoding operation is performed again, the first codeword which originally failed to be decoded tends to become capable of being successfully decoded due to this specific information.

In a case of combining "flipping data" with "weakening the weight," when the mark information in step S240 indicates that a change has occurred from a codeword bit of the second codeword (another codeword which can be successfully decoded) to a corresponding bit of the decoded data, and the reliability information of the codeword bit indicates that the codeword bit is "strongly reliable," in step S490, the decoding circuit 120 may change the codeword bit from "strong 1" to "weak 0" or from "strong 0" to "weak 1," thus obtaining a modified codeword and modified information. In step S430, the decoding circuit 120 may perform said soft decoding operation again on said modified codeword using said modified information. In other words, the specific information (the bit position of the changed bit) is captured from the successfully decoded second codeword, and the specific information is then provided as feedback for the first codeword which has failed to be decoded and the reliability information (also called the weight) thereof, and said soft decoding operation is then performed again. After said soft decoding operation is performed again, the first codeword which originally failed to be decoded tends to become capable of being successfully decoded due to this specific information.

In a case of "marking erasure," said "reference information" may include reliability information (also called a weight) and erasure information. When the mark information in step S240 indicates that a change has occurred from a codeword bit of the second codeword (another codeword which can be successfully decoded) to a corresponding bit of the decoded data, and the reliability information of the codeword bit indicates that the codeword bit is "strongly reliable," in step S490, the decoding circuit 120 may mark erasure information of the codeword bit as "neutral," thus obtaining modified information. In step S430, the decoding circuit 120 may perform said soft decoding operation again on the first codeword using said modified information. In other words, the specific information (the bit position of the changed bit) is captured from the successfully decoded second codeword, and the specific information is then provided as feedback for the erasure information of the first codeword which has failed to be decoded and on which said soft decoding operation is then performed again. After said soft decoding operation is performed again, the first codeword which originally failed to be decoded tends to become capable of being successfully decoded due to this specific information.

Figure 5:
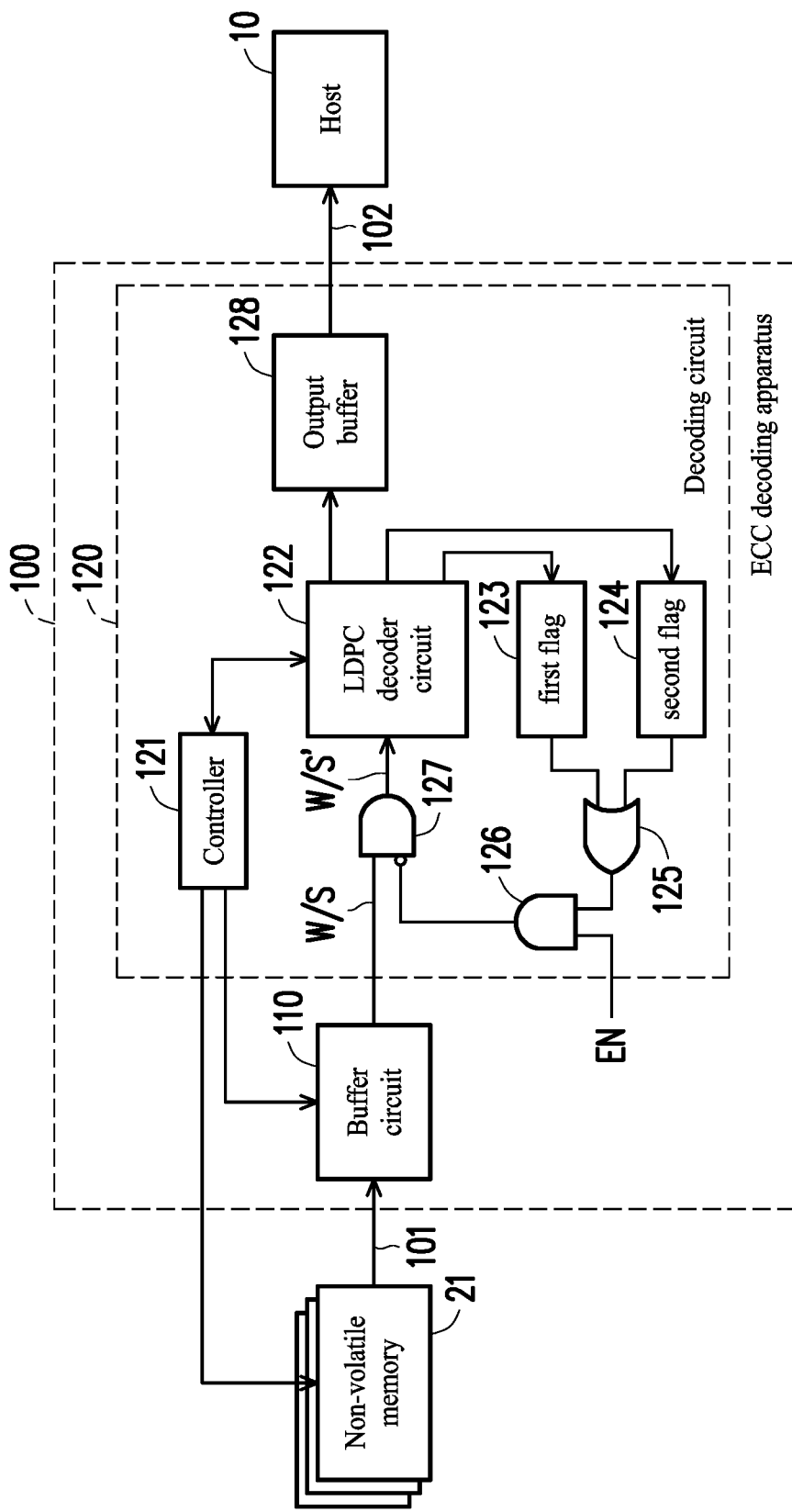
FIG. 5 is a schematic circuit block diagram illustrating a decoding circuit shown in FIG. 1 according to an embodiment of the invention.

FIG. 5 is a schematic circuit block diagram illustrating the decoding circuit 120 shown in FIG. 1 according to an embodiment of the invention. The decoding circuit 120 shown in FIG. 5 includes the controller 121, an LDPC decoder circuit 122, a first flag 123, a second flag 124, an OR gate 125, a first AND gate 126, a second AND gate 127 and an output buffer 128. The first flag 123, the second flag 124, the OR gate 125, the first AND gate 126 and the second AND gate 127 shown in FIG. 5 are suitable for a bit among a plurality of bits of decoded data. Descriptions related to the first flag 123, the second flag 124, the OR gate 125, the first AND gate 126 and the second AND gate 127 shown in FIG. 5 may also apply to the other bits of the decoded data and are thus not repeated. That is, assuming that the decoded data has eight bits, then there are also eight circuit assemblies (the first flag 123, the second flag 124, the OR gate 125, the first AND gate 126 and the second AND gate 127 are collectively regarded as one circuit assembly) in FIG. 5.

The non-volatile memory 21 may set one or more read voltages (also called threshold voltages) according to a command from the controller 121. According to the read voltage or read voltages, the non-volatile memory 21 may convert the set of corresponding data voltages into the corresponding codeword 101. The LDPC decoder circuit 122 is coupled to the controller 121 and the buffer circuit 110. The LDPC decoder circuit 122 may perform an LDPC decoding operation on the codeword provided by the buffer circuit 110 using the reference information provided by the buffer circuit 110. In the present embodiment, said reference information includes "reliability information" (also called a weight). In some embodiments, the reliability information may be generated during a soft decoding operation performed by the decoding circuit 120, and the decoding circuit 120 then stores the reliability information in the buffer circuit 110. In some other embodiments, the reliability information may be generated by the non-volatile memory 21 in response to a command given to the non-volatile memory 21 by the decoding circuit 120, and the non-volatile memory 21 then stores the reliability information in the buffer circuit 110.

When a codeword (referred to as the second codeword) is successfully decoded, the LDPC decoder circuit 122 may produce the decoded data. The LDPC decoder circuit 122 may check whether a "change" has occurred from a codeword bit of the second codeword to a corresponding bit of the decoded data. The conditions for causing said "change" to occur can be understood by referring to relevant descriptions of FIG. 1 to FIG. 4, and details thereof are thus omitted. For example, when a certain codeword bit of the second codeword is logic 1 and a corresponding bit of the decoded data is logic 0, and the reliability information of the codeword bit indicates that the codeword bit is "strongly reliable," the LDPC decoder circuit 122 sets the first flag 123, otherwise the LDPC decoder circuit 122 resets the first flag 123. When the codeword bit is logic 0 and the corresponding bit of the decoded data is logic 1, and the reliability information of the codeword bit indicates that the codeword bit is "strongly reliable," the LDPC decoder circuit 122 sets the second flag 124, otherwise the LDPC decoder circuit 122 resets the second flag 124.

A first input terminal and a second input terminal of the OR gate 125 are respectively coupled to the first flag 123 and the second flag 124. A first input terminal of the first AND gate 126 is coupled to an output terminal of the OR gate 125. A second input terminal of the first AND gate 126 receives an enable signal EN. A non-inverting input terminal of the second AND gate 127 is coupled to the buffer circuit 110 to receive reliability information W/S of the codeword bit. An inverting input terminal of the second AND gate 127 is coupled to an output terminal of the first AND gate 126. An output terminal of the second AND gate 127 is coupled to the LDPC decoder circuit 122 to provide reliability information W/S' of the codeword bit. Thus, assuming that the enable signal EN is logic 1, when the codeword bit of "strong 1" changes into the corresponding bit of "strong 0" or "weak 0" of the decoded data, or the codeword bit of "strong 0" changes into the corresponding bit of "strong 1" or "weak 1" of the decoded data, although the reliability information W/S provided by the buffer circuit 110 is logic 1 (indicating "strongly reliable"), the reliability information W/S' outputted from the second AND gate 127 is logic 0, so as to indicate that bit data of the codeword bit is "weakly reliable." Therefore, the circuit of the example shown in FIG. 5 may realize the mechanism of "weakening the weight." The LDPC decoder circuit 122 may perform the LDPC decoding operation again on the first codeword provided by the buffer circuit 110 using the reliability information W/S' (modified information).

In summary, if another codeword (the second codeword) sharing the same bit line with the first codeword (the codeword which has failed to be decoded by LDPC decoding) is successfully decoded, the specific information (the bit position of the changed bit) may be captured from the successfully decoded second codeword, and the specific information is then provided as feedback for the reliability information (also called the weight) of the first codeword which has failed to be decoded and on which the LDPC decoding is then performed again. After the LDPC decoding is performed again, the first codeword which originally failed to be decoded tends to become capable of being successfully decoded due to this specific information.

It is worth noting that, in different application scenarios, the relevant functions of the ECC decoding apparatus 100, the buffer circuit 110, the decoding circuit 120, the controller 121 and/or the LDPC decoder circuit 122 may be implemented as software, firmware or hardware using general programming languages (e.g., C or C++), hardware description languages (HDLs) (e.g., Verilog HDL or VHDL) or any other suitable programming languages. The programming languages capable of executing said relevant functions may be deployed as any computer-accessible media, such as magnetic tapes, semiconductor memories, magnetic disks or compact disks (e.g., CD-ROMs or DVD-ROMs). Alternatively, said programming languages may be transmitted or delivered through the Internet, wired communication, wireless communication or any other communication medium. Said programming languages may be stored in a computer-accessible medium, such that a processor of the computer may access/execute programming codes of said software (or firmware). As for hardware implementation, in combination with the aspects disclosed by the embodiments herein, the various illustrative logic, logical blocks, modules and circuits used in one or more controllers, microcontrollers, microprocessors, application-specific integrated circuits (ASICs), digital signal processors (DSPs), field programmable gate arrays (FPGAs) and/or other processing units may be utilized to realize or execute the functions described herein. In addition, the apparatus and method may be implemented by a combination of hardware and software.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An error checking and correcting (ECC) decoding method, comprising:
   temporarily storing, by a buffer circuit, at least one codeword outputted from a non-volatile memory;
   performing an ECC decoding operation on the at least one codeword using reference information by a decoding circuit, wherein when the decoding circuit fails to decode a first codeword of the at least one codeword by the ECC decoding operation, the decoding circuit performs the ECC decoding operation on a second codeword of the at least one codeword to produce decoded data;
   checking whether a change has occurred from each codeword bit of the second codeword to a corresponding bit of the decoded data by the decoding circuit;
   determining whether a bit position of the changed corresponding bit is present among all bit Positions of the first codeword by the decoding circuit, comprising:
   if the bit position is presented, in accordance with the bit position of the changed corresponding bit, correspondingly changing a bit value located in the bit position in the first codeword to change the first codeword to a modified codeword by the decoding circuit, or correspondingly changing a reference value located in the bit position in the reference information to change the reference information to modified information by the decoding circuit, and if the bit position is not presented, performing the ECC decoding operation on another codeword of the at least one codeword to produce decoded data by the decoding circuit; and performing the ECC decoding operation again on the modified codeword by the decoding circuit, or performing the ECC decoding operation again on the first codeword using the modified information by the decoding circuit, or performing the ECC decoding operation again on the modified codeword using the modified information by the decoding circuit.

2. The ECC decoding method according to claim 1, wherein the first codeword and the second codeword come from the same bit lines in the non-volatile memory.

3. The ECC decoding method according to claim 2, wherein the first codeword and the second codeword come from different pages of the same paired pages in the non-volatile memory.

4. The ECC decoding method according to claim 2, wherein the first codeword and the second codeword come from different paired pages in the non-volatile memory.

5. The ECC decoding method according to claim 1, wherein that the change has occurred in the corresponding bit refers to a situation in which the change has occurred from a codeword bit of the second codeword to the corresponding bit of the decoded data and reliability information of the codeword bit indicates that the codeword bit is strongly reliable.

6. The ECC decoding method according to claim 1, wherein the reference information comprises reliability information, and the step of correspondingly changing the reference value located in the bit position in the reference information comprises:

changing the reliability information of a codeword bit to weakly reliable by the decoding circuit when the change has occurred from the codeword bit of the second codeword to the corresponding bit of the decoded data and the reliability information of the codeword bit indicates that the codeword bit is strongly reliable.

7. The ECC decoding method according to claim 1, wherein the reference information comprises reliability information and erasure information, and the step of correspondingly changing the reference value located in the bit position in the reference information comprises:

marking the erasure information of a codeword bit as neutral by the decoding circuit when the change has occurred from the codeword bit of the second codeword to the corresponding bit of the decoded data and the reliability information of the codeword bit indicates that the codeword bit is strongly reliable.

8. An error checking and correcting (ECC) decoding apparatus, comprising:

a buffer circuit, temporarily storing at least one codeword outputted from a non-volatile memory; and a decoding circuit, coupled to the buffer circuit, performing an ECC decoding operation on the at least one codeword using reference information, wherein when the decoding circuit fails to decode a first codeword of the at least one codeword by the ECC decoding operation, the decoding circuit performs the ECC decoding operation on a second codeword of the at least one codeword to produce decoded data, the decoding circuit checks whether a change has occurred from each codeword bit of the second codeword to a corresponding bit of the decoded data, the decoding circuit determines whether a bit position of the changed corresponding bit is present among all bit positions of the first codeword, comprising:

if the bit position is presented, in accordance with the bit position of the changed corresponding bit, the decoding circuit correspondingly changes a bit value located in the bit position in the first codeword to change the first codeword to a modified codeword or correspondingly changes a reference value located in the bit position in the reference information to change the reference information to modified information, and if the bit position is not presented, the decoding circuit performs the ECC decoding operation on another codeword of the at least one codeword to produce decoded data, and the decoding circuit performs the ECC decoding operation again on the modified codeword or performs the ECC decoding operation again on the first codeword using the modified information or performs the ECC decoding operation again on the modified codeword using the modified information.

9. The ECC decoding apparatus according to claim 8, wherein the first codeword and the second codeword come from the same bit lines in the non-volatile memory.

10. The ECC decoding apparatus according to claim 9, wherein the first codeword and the second codeword come from different pages of the same paired pages in the non-volatile memory.

11. The ECC decoding apparatus according to claim 9, wherein the first codeword and the second codeword come from different paired pages in the non-volatile memory.

12. The ECC decoding apparatus according to claim 8, wherein that the change has occurred in the corresponding bit refers to a situation in which the change has occurred from a codeword bit of the second codeword to the corresponding bit of the decoded data and reliability information of the codeword bit indicates that the codeword bit is strongly reliable.

13. The ECC decoding apparatus according to claim 8, wherein the reference information comprises reliability information, and the decoding circuit changes the reliability information of a codeword bit to weakly reliable when the change has occurred from the codeword bit of the second codeword to the corresponding bit of the decoded data and the reliability information of the codeword bit indicates that the codeword bit is strongly reliable.

14. The ECC decoding apparatus according to claim 8, wherein the reference information comprises reliability information and erasure information, and the decoding circuit marks the erasure information of a codeword bit as neutral when the change has occurred from the codeword bit of the second codeword to the corresponding bit of the decoded data and the reliability information of the codeword bit indicates that the codeword bit is strongly reliable.

15. The ECC decoding apparatus according to claim 8, wherein the reference information comprises reliability information, and the decoding circuit comprises:

a first flag;

a second flag;

a low density parity check (LDPC) decoder circuit, coupled to the buffer circuit, performing an LDPC decoding operation on the at least one codeword using the reference information, and checking whether a change has occurred from a codeword bit of the second codeword to the corresponding bit of the decoded data, wherein the LDPC decoder circuit sets the first flag when the codeword bit of the second codeword is logic 1 and the corresponding bit of the decoded data is logic 0 and the reliability information of the codeword bit indicates that the codeword bit is strongly reliable, and the LDPC decoder circuit sets the second flag when the codeword bit of the second codeword is logic 0 and the corresponding bit of the decoded data is logic 1 and the reliability information of the codeword bit indicates that the codeword bit is strongly reliable;

an OR gate, having a first input terminal and a second input terminal respectively coupled to the first flag and the second flag;

a first AND gate, having a first input terminal coupled to an output terminal of the OR gate, wherein a second input terminal of the first AND gate receives an enable signal; and a second AND gate, having a non-inverting input terminal receiving the reliability information of the codeword bit, wherein an inverting input terminal of the second AND gate is coupled to an output terminal of the first AND gate, and an output terminal of the second AND gate is coupled to the LDPC decoder circuit.

* * * * *